United States Patent
Ott et al.

(10) Patent No.: US 6,992,391 B2
(45) Date of Patent: Jan. 31, 2006

(54) DUAL-DAMASCENE INTERCONNECTS WITHOUT AN ETCH STOP LAYER BY ALTERNATING ILDS

(75) Inventors: Andrew Ott, Hillsboro, OR (US); Lawrence Wong, Beaverton, OR (US); Patrick Morrow, Portland, OR (US); Jihperng Leu, Portland, OR (US); Grant M. Kloster, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 81 days.

(21) Appl. No.: 09/968,459

(22) Filed: Sep. 28, 2001

(65) Prior Publication Data

US 2003/0064580 A1 Apr. 3, 2003

(51) Int. Cl.
*H01L 23/48* (2006.01)

(52) U.S. Cl. ............... 257/758; 438/622; 257/759
(58) Field of Classification Search ......... 257/758–760, 257/635–637, 642–643, 767, 774; 438/618, 438/622, 624, 737, 738, 780, 761, 763
See application file for complete search history.

(56) References Cited

U.S. PATENT DOCUMENTS

| 6,127,258 A | 10/2000 | Watanabe et al. |
| 6,165,898 A | 12/2000 | Jang et al. |
| 6,287,955 B1 * | 9/2001 | Wang et al. ............... 438/623 |
| 6,287,961 B1 | 9/2001 | Liu et al. |
| 6,395,632 B1 * | 5/2002 | Farrar ..................... 438/687 |
| 6,576,550 B1 * | 6/2003 | Brase et al. ............... 438/687 |
| 2002/0024150 A1 | 2/2002 | Farrar |
| 2003/0001240 A1 * | 1/2003 | Whitechair et al. ......... 257/638 |

FOREIGN PATENT DOCUMENTS

| EP | 0 945 900 A1 | 9/1999 |
| WO | WO 00/10202 | 2/2000 |

OTHER PUBLICATIONS

Int'l Search Report, Int'l Application No. PCT/US02/31159, mailed Jul. 11, 2003, 5 pages.

* cited by examiner

*Primary Examiner*—Hoai Pham
*Assistant Examiner*—Ginette Peralta
(74) *Attorney, Agent, or Firm*—Blakely, Sokoloff, Taylor & Zafman LLP

(57) ABSTRACT

A dual-damascene process where first alternate ILDs are made of a first material and second alternate ILDs are made of a second material. Each material is etchable at a faster rate than the other in the presence of different etchant such as for an organic polymer and an inorganic low k material. This allows the ILDs to be deposited alternately on one another without an etchant stop layer thereby reducing capacitance.

15 Claims, 2 Drawing Sheets

US 6,992,391 B2

DUAL-DAMASCENE INTERCONNECTS WITHOUT AN ETCH STOP LAYER BY ALTERNATING ILDS

FIELD OF THE INVENTION

The invention relates to field of fabrication of interconnect layers in a semiconductor device.

PRIOR ART AND RELATED ART

In current integrated circuits, several layers of interconnect structures fabricated above a substrate containing active devices are often used. Each interconnect layer is fabricated in, or on, an interlayer dielectric (ILD). Vias are etched in each ILD to make contact with conductors in an underlying layer. It is generally accepted that the dielectric material in each ILD should have a low k to obtain low capacitance between the conductors. Often the low k dielectrics have low densities and etch quite rapidly. Particularly for unlanded contacts, over etching can occur and extend into an underlying layer causing a defect. For this reason, etchant stops are formed between each layer. Unfortunately, these etchant stop layers typically have higher k values, and thereby increase the capacitance between conductors.

The problem is shown in FIG. 1 where a first ILD 10 includes a copper conductor and via fabricated with a dual damascene process. When an opening 12 is etched into the next ILD 11, the layer 13 acts as an etchant stop to prevent etching into the underlying ILD 10. But for the layer 13, the region shown by the dotted line 14 may be etched away causing a defect. Consequently, the layer 13 is needed even though it increases the capacitance between conductors.

Typically the layer 13 acts both as an etchant stop and as a diffusion barrier. Layer 13's role as an etchant stop is the major contributor to the capacitance since a layer thickness of 800–1600 Å is often used for the etchant stop function compared to only 200 Å needed to provide the barrier function.

Another technology that may be used instead of using the layer 13 of FIG. 1 as a barrier layer is to use a shunt layer with cobalt or nickel or an alloy thereof. This involves the selection deposition of a shunting material over the copper lines to present electromigration into the overlying ILD. This is discussed in co-pending application Ser. No. 09/753,256; Interconnect Structures and a Method of Electroless Introduction of Interconnect Structures, assigned to the assignee of the present application, filed Dec. 28, 2000.

DETAILED DESCRIPTION

An integrated circuit interconnect structure and process for fabricating the structure is described. In the following description, numerous specific details are set forth such as specific-interlayer dielectrics (ILD) materials in order to provide a thorough understanding of the present invention. It will be apparent to one skilled in the art that the present invention may be practiced without these specific details. In other instances, well known processing steps, such as etching and deposition steps, are not described in detail in order not to unnecessarily obscure the disclosure.

The present invention uses at least two different ILD materials which are alternated from one interconnect level to the next. The materials are selected such that each of the materials is etchable more rapidly in the presence of the other material. In one embodiment, the first material is an organic low k dielectric such as a polymer based dielectric and the second material is an inorganic material such a carbon-doped oxide.

The first category of materials, the organic polymers, are typically spun-on. A discussion of perfluorocyclobutane (PFCB) organic polymers is found in "Integration of Perfluorocyclobutane (PFCB)", by C. B. Case, C. J. Case, A. Komblit, M. E. Mills, D. Castillo, R. Liu, Conference Proceedings, ULSI XII.COPYRGT. 1997, Materials Research Society, beginning at page 449. These polymers are available from companies such as Dupont, Allied Signal, Dow Chemical, Dow Corning, and others.

The second category of materials that may be used in the present invention are silica-based such as the nanoporous silica aerogel and xerogel. These dielectrics are discussed in "Nanoporous Silica for Dielectric Constant Less than 2", by Ramos, Roderick, Maskara and Smith, Conference Proceedings ULSI XII.COPYRGT. 1997, Materials Research Society, beginning at page 455 and "Porous Xerogel Films as Ultra-Low Permittivity Dielectrics for ULSI Interconnect Applications", by Jin, List, Lee, Lee, Luttmer and Havermann, Conference Proceedings ULSI XII.COPYRGT. 1997, Materials Research Society, beginning at page 463.

Assume for sake of discussion that a process has six levels of metalization, identified as ILDs 0–5. While the present invention in some cases may be used in all of the six levels of ILD, in one embodiment it is used for levels 1–4. The 0 level ILD generally contacts the substrate and may require different processing such as discussed in U.S. Pat. No. 6,124,191. The uppermost ILD level typically receives special processing for packaging purposes such as the inclusion of bumps, and for this reason, an undoped silicon dioxide layer may be used.

Figure 3:
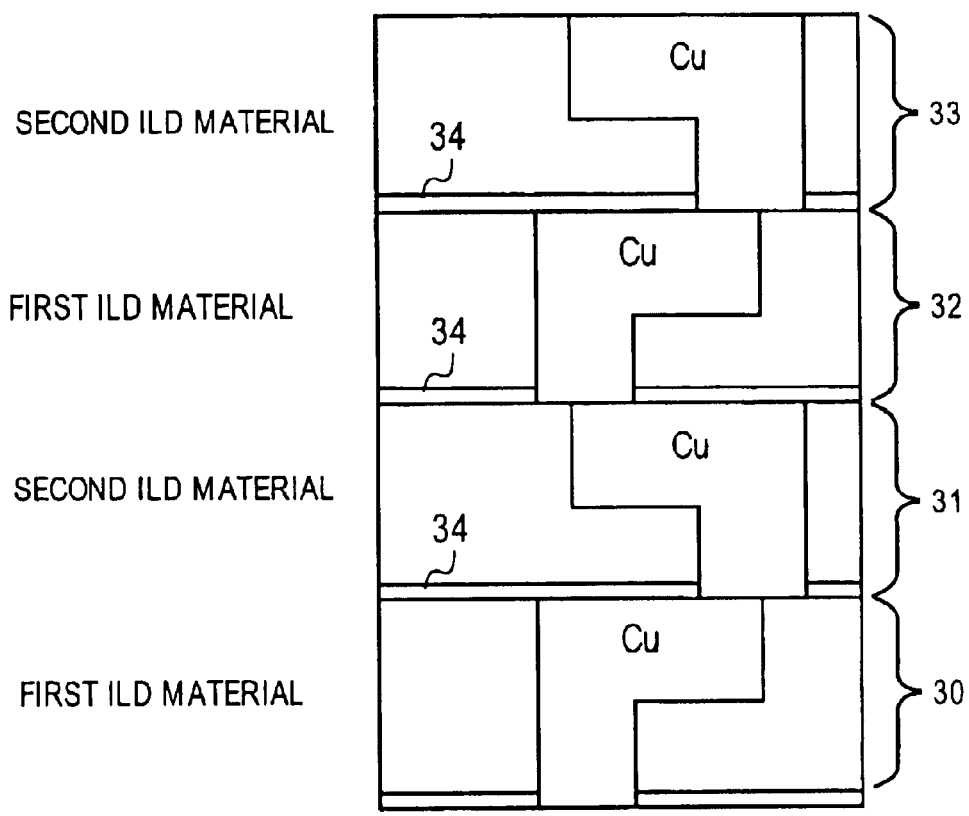
FIG. 3 is a cross-sectional elevation view showing several ILDs fabricated with an embodiment of the present invention.

Referring to FIG. 3, the structure for four consecutive ILD levels 30, 31, 32, and 33 is illustrated. These levels may be levels 1–4 in a six level metalization process. Levels one and three are formed from a first ILD material which may be, for instance, a low k carbon-doped oxide. The alternate layers 31 and 33, as indicated, are fabricated from a second ILD material such as a polymer based dielectric.

As shown is FIG. 3, vias and conductors are formed in each of the ILDs 30–33. These vias and conductors may be formed in an ordinary way using, for instance, a dual-damascene process. In this case, both the vias and conductors may, for instance, be fabricated from a copper or copper alloy which is enclosed within a conductive barrier material to prevent the copper from diffusing into adjacent dielectric materials.

In FIG. 3, a barrier layer of silicon nitride or silicon carbide 34 is used between the ILDs. This dielectric prevents the copper from diffusing into the ILDs. Layer 34, as mentioned above, may be relatively thin (e.g. 200 Å) since it is not used as an etchant stop. Thus, it does not add to the interconnector and interconductor capacitance to the extent that the thicker etchant stop would.

Figure 2:
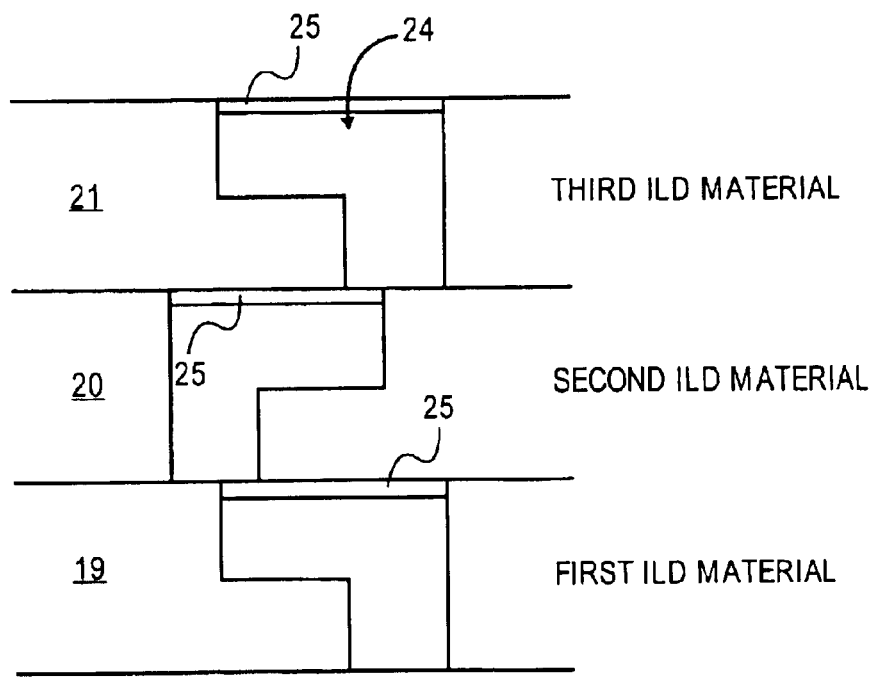
FIG. 2 is a cross-sectional elevation view showing two ILDs as fabricated in accordance with an embodiment of the present invention.

In FIG. 2, some of the processing used to fabricate a structure for one embodiment is illustrated. First ILD 19 is fabricated from a first material such as the polymer based dielectric and includes vias and conductors. A shunting layer 25 is added over the copper conductors to prevent electromigration for this embodiment. Then ILD 20 is formed from a second dielectric material such as the carbon-doped oxide. Vias and conductors are fabricated in ILD 20 along with the shunting layer 25. All of this is done with known processing steps.

Figure 1:
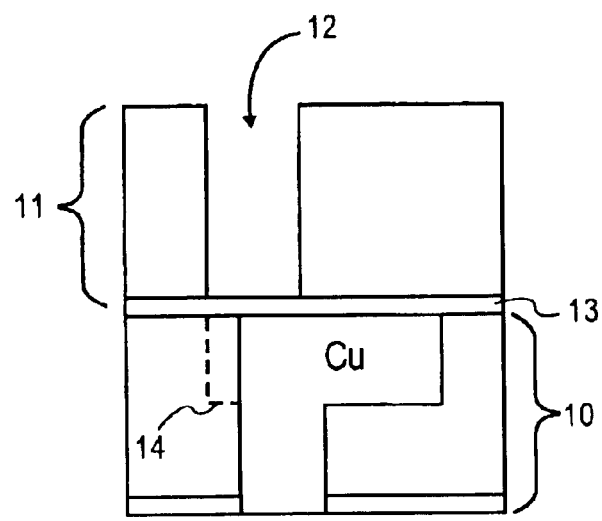
FIG. 1 is a cross-sectional elevation view showing two levels of an interlayer dielectric (ILD) as used in the prior art.

Now an ILD 21 is formed directly on ILD 20 without an intermediate etchant stop such as layer 13 of FIG. 1. ILD 21 is fabricated from a first material such as the polymer based dielectric.

Patterning is used for each layer to define the via and conductor openings such as with a sacrificial light absorbing material (SLAM) or a dual hard masked process to form the opening 24 and like openings or a combination of these steps. The opening 24, is used to form a contact and conductor.

In FIG. 2, a shunting material is used to provide a barrier whereas in FIG. 3, a dielectric is used for the barrier. Both may be used at the same level in the ILDs or they may be alternated. For instance, after the shunting material has been deposited, the barrier dielectric may be formed. An opening is etched in the dielectric for a via when the via/conductor openings are etched for the overlying ILD.

Importantly, with the disclosed embodiment, the first material etches with a first etchant more rapidly than the underlying second material of the ILD 20. Preferably the differential etching rate is 20 to 1, or greater. Thus, when the opening 24 is etched, and the etchant reaches the second material, very little etching occurs in the ILD second material. For this reason, the defect shown by the dotted line 14 of FIG. 1 does not occur even though there is no etchant stop.

Similarly, when the openings were etched in the ILD 20, an etchant is used that etches the second material more rapidly than the first material. Thus, when an opening was etched in the ILD 20, the etchant did not etch into the underlying first material. Again it is preferred that the etchant used to etch the first material etches this material at a rate at least 20 times faster than the first material.

While in one embodiment all the odd number ILD levels are made from a first material and all the even number ILD levels are made from a second material, this is not necessary. Each layer may have a different material as long as a layer can be etched at a higher rate than the underlying layer. However, it may be more cost effective for all the odd numbered layers to be made of a first material and all of the even numbered layers to be made of a second material.

The inorganic materials discussed above may be etched with fluorocarbon such as $C_4F_8$, $C_5F_8$, $C_2F_6$, $C_4F_6$, $CF_4$ or $CH_2F_2$. The fluorocarbon is typically used in a mixture with oxygen and argon. A selective of 20 to 1 is achievable between the inorganic or organic ILDs discussed above.

The organic polymers discussed above may be etched with hydrogen or oxygen which in effect bums the polymer in a mixture with nitrogen. A selective of 30 to 1 is achievable between the organic and inorganic dielectrics.

Thus, ILDs with reduced capacitance has been disclosed.

What is claimed is:

1. An integrated circuit comprising:
    a first interlayer dielectric (ILD) consisting of only a first dielectric material, the first material having a first etchant rate when exposed to a first etchant, wherein the first ILD includes a first conductor and an underlying first via both entirely inlaid in the first dielectric material;
    a second ILD consisting of only a second dielectric material disposed directly on the first ILD, the second dielectric material having an etchant rate slower than the first etchant rate when exposed to the first etchant, wherein the second ILD includes a second conductor and an underlying second via both entirely inlaid in the second dilectric such that the interface between the first and second ILDs is of dielectric materials having different etch rates;
    a third ILD disposed directly on the second ILD consisting of only the first dielectric material, wherein the third ILD includes a third conductor and an underlying third via entirely inlaid in the third ILD consisting of the first dielectric material.

2. The integrated circuit defined by claim 1 wherein the second dielectric material etches more rapidly than the first dielectric material when exposed to a second etchant different than the first etchant.

3. The integrated circuit defined by claim 2 wherein the first dielectric material comprises an organic based dielectric.

4. The integrated circuit defined by claim 3 wherein the second dielectric material comprises a non-organic based dielectric.

5. The integrated circuit defined by claim 1 including a fourth ILD disposed directly on the third ILD consisting of only the second dielectric material.

6. The integrated circuit defined by claim 5 wherein, the first dielectric material comprises a polymer based dielectric.

7. The integrated circuit defined by claim 6 wherein, the second dielectric material comprises a carbon-doped oxide.

8. An integrated circuit comprising:
    first interlayer dielectrics (ILDs) consisting entirely of a first material disposed alternately between second ILDs consisting entirely of a second material wherein each of the first and second materials are etchable at faster rates than the other in the presence of different etchants, wherein the first ILDs comprise first conductors and first underlying first vias entirely disposed in the first ILDs, wherein the second ILDs comprise second conductors and underlying second vias entirely disposed in the second ILDs, and wherein the interface between each of the first and second ILDs consists of the first and second materials being directly in contact with one another.

9. The integrated circuit defined by claim 8 wherein a shunting layer is added over the first conductors.

10. The integrated circuit defined by claim 8 wherein the first material is an organic based dielectric.

11. The integrated circuit defined by claim 10 wherein the second material is a non-organic based dielectric.

12. An integrated circuit comprising:
    a first interlayer dielectric (ILD) consisting entirely of a first material;
    a second ILD consisting entirely of a second material disposed directly on the first ILD, the second material being etchable at a faster rate than the first material by a first etchant;
    a third ILD disposed directly on the second ILD, the third ILD consisting entirely of the first material, wherein each of the ILD layers comprises conductors and underlying vias entirely disposed in their respective ILDs such that the interface between the ILDs are formed from the first material and second material in contact with one another.

13. The integrated circuit defined by claim 12 including a fourth ILD consisting entirely of the second material disposed directly on the third ILD.

14. The integrated circuit defined by claim 13 wherein, the first material is a polymer based dielectric.

15. The integrated circuit defined by claim 14 wherein, the second material is a carbon-based oxide.

* * * * *